United States Patent [19]

Hagiwara et al.

[11] Patent Number: 4,654,828
[45] Date of Patent: * Mar. 31, 1987

[54] NONVOLATILE SEMICONDUCTOR MEMORY

[75] Inventors: Takaaki Hagiwara, Kodaira; Yokichi Itoh, Hachioji; Ryuji Kondo, Kodaira; Yuji Yatsuda, Hachioji; Shinichi Minami, Kokubunji, all of Japan

[73] Assignee: Hitachi, Ltd., Tokyo, Japan

[*] Notice: The portion of the term of this patent subsequent to Jun. 18, 2002 has been disclaimed.

[21] Appl. No.: 787,021

[22] Filed: Oct. 15, 1985

Related U.S. Application Data

[63] Continuation of Ser. No. 554,958, Nov. 25, 1983, abandoned, which is a continuation of Ser. No. 193,124, Oct. 2, 1980, Pat. No. 4,460,980, which is a continuation of Ser. No. 949,244, Oct. 6, 1978, abandoned.

[30] Foreign Application Priority Data

Oct. 17, 1977 [JP] Japan ................... 52-123479

[51] Int. Cl.[4] ............... G11C 11/40; H01L 29/78; H01L 27/02; H01L 29/34
[52] U.S. Cl. ................... 365/184; 357/23.5; 357/23.11; 357/41; 357/54; 357/59
[58] Field of Search ............ 357/23.5, 41, 54; 365/184

[56] References Cited

U.S. PATENT DOCUMENTS

| 3,836,992 | 9/1974 | Abbas et al. ................ 357/54 |
| 3,906,296 | 9/1975 | Maserjian et al. ........... 357/23 VT |
| 4,030,081 | 6/1977 | Horninger ................... 357/54 |
| 4,055,837 | 10/1977 | Stein et al. ................ 357/54 |
| 4,090,259 | 5/1978 | Wilcock et al. ............. 357/54 |
| 4,175,291 | 11/1979 | Spence ...................... 357/54 |
| 4,342,099 | 7/1982 | Kuo ......................... 357/23 VT |
| 4,385,308 | 5/1983 | Uchida ...................... 357/41 |
| 4,460,980 | 7/1984 | Hagiwara et al. ............ 357/54 |

OTHER PUBLICATIONS

Das Gupta et al., "Dual–Gate Famos Memory Cell" IBM Technical Disclosure Bulletin vol. 17 (1/75) p. 2266.
Hagiwara et al., "A 16 Kb Electrically Erasable Programmable ROM" IEEE Int. Solid–State Circuits Conf. (2/79), Dig. Tech. Papers, pp. 50–51, 277.
Uchiumi et al., "A High Speed 16 K Bit Electrically Erasable Prom" Midcon Professional Program (11/79), Session 21, 6 pages.

Primary Examiner—Gene M. Munson
Attorney, Agent, or Firm—Antonelli, Terry & Wands

[57] ABSTRACT

A semiconductor nonvolatile memory wherein a unit cell is constructed of a series connection consisting of an MNOS (metal-silicon nitride-silicon dioxide-semiconductor) transistor whose gate electrode is made of polycrystalline silicon and an MOS (metal-silicon dioxide-semiconductor) transistor whose gate electrode is also made of polycrystalline silicon, such unit cells being arrayed in the form of a matrix, and wherein the gate electrode of the MOS transistor is used as a reading word line, the gate electrode of the MNOS transistor is used as a writing word line, and a terminal of either of the MNOS transistor and the MOS transistor connected in series and constituting the unit cell is used as a data line.

8 Claims, 19 Drawing Figures

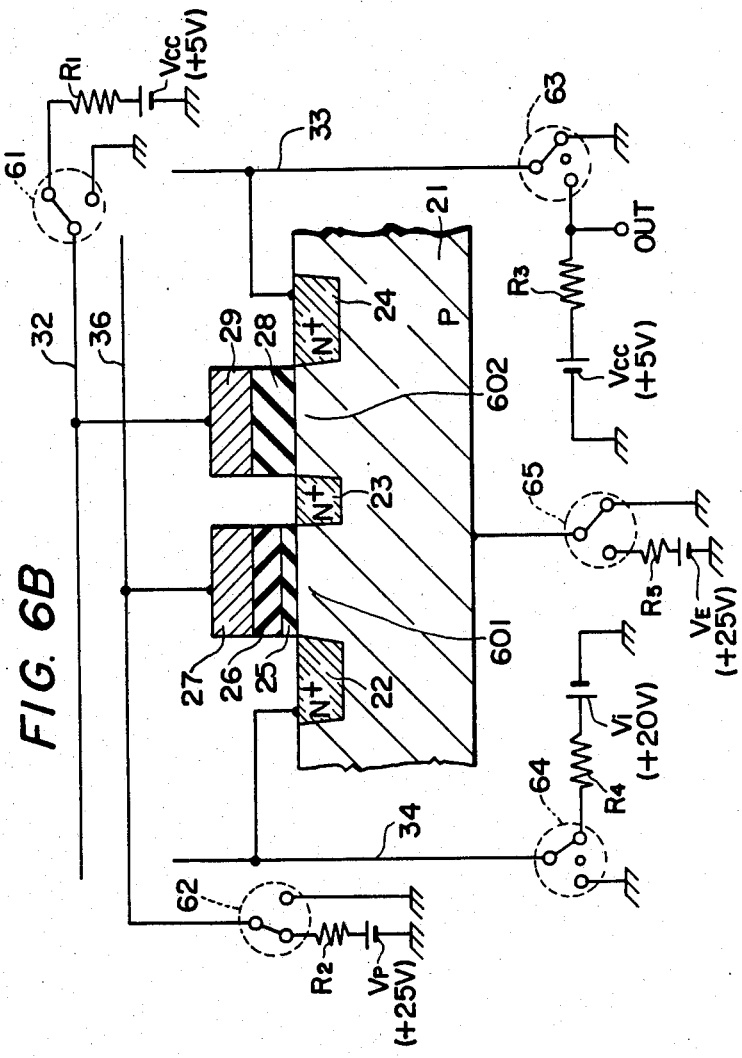

NONVOLATILE SEMICONDUCTOR MEMORY

This application is a continuation of application Ser. No. 554,958, filed 11/25/83, now abandoned, which is a continuation of application Ser. No. 193,124, filed 10/2/80, now U.S. Pat. No. 4,460,980, which is a continuation of application Ser. No. 949,244, filed 10/6/78, now abandoned.

BACKGROUND OF THE INVENTION (1) Field of the Invention

This invention relates to a nonvolatile semiconductor memory. More particularly, the invention relates to a memory comprising a plurality of semiconductor devices having a memory function, the memory being capable of writing and erasing information electrically.

(2) Description of the Prior Art

As a nonvolatile semiconductor memory capable of writing and erasing information electrically (hereinbelow, termed "EAROM" which is short for "electrically alterable read only memory"), there has been known a device wherein metal-nitride-oxide-semiconductor field-effect transistors (hereinafter, abbreviated to "MNOS Tr's") are arrayed in the form of a matrix (J. T. Wallmark et al: International Electron Devices Meeting, Abstract page 140 (1968, Oct.)). In the MNOS Tr, electrons and holes are injected into traps in the interface between two kinds of insulating films ($Si_3N_4$ film and $SiO_2$ film) through the thin $SiO_2$ film from an Si side by the tunnel effect. FIG. 1 shows a sectional view of a prior-art MNOS Tr. As illustrated in the figure, the MNOS Tr having hitherto been known is of the P-channel type and employs a gate electrode of aluminum (Al). Referring to the figure, numeral 11 designates a silicon (Si) body of N-type conductivity, numerals 12 and 13 diffusion layers of $P^+$-type conductivity to serve as source and drain regions respectively, numeral 14 an $SiO_2$ film, numeral 15 an $Si_3N_4$ film, and numeral 16 an Al electrode to serve as a gate electrode. The EAROM which uses the prior-art P-channel MNOS Tr's employing the Al gate as shown in FIG. 1 has many disadvantages as follows:

(1) The operating speed is very low.
(2) The bit capacity is small.
(3) The number of read accesses after writing data is subject to limitation, and when the data are read out approximately $10^7$–$10^{11}$ times, the disappearance of the data takes place.
(4) The unpowered nonvolatile data storage time of the memory is short.
(5) The number of write-erase cycles is subject to limitation, and is approximately $10^4$–$10^6$.

The disadvantage (5) results from the employment of the MNOS Tr itself, and drastic improvements are difficult. As regards the items (1) to (4), the enhancement of performance is desired, but any especially effective betterment has heretofore been made.

SUMMARY OF THE INVENTION

This invention has for its object to eliminate the disadvantages of the prior-art EAROM employing the MNOS Tr's, and to provide an EAROM in or with which:

(1) the integration density is high,
(2) the operating speed is high,
(3) the number of read accesses is not limited, and
(4) the nonvolatile data storage time is long, as well as a nonvolatile semiconductor memory device which can be constructed with such an EAROM.

The nonvolatile semiconductor memory device is this invention consists of an MNOS Tr serving as a memory element and a conventional metal-insulator-semiconductor field-effect transistor (hereinbelow, abbreviated to "MIS Tr") serving as a switching element, the two elements connected in series. In particular, polycrystalline silicon (poly-Si) is used for the gates of the MNOS Tr and the MIS Tr. This invention is applicable to the MNOS Tr's of both the P- and N-channel types, and it is greatly effective especially when applied to the N-channel transistor.

BRIEF DESCRIPTION OF THE DRAWINGS

FIG. 6B is a schematic circuit diagram showing a method of applying a voltage in the writing mode of the memory device of this invention.

DESCRIPTION OF THE PREFERRED EMBODIMENTS

The present invention will now be described in detail by reference to the following embodiments.

Figure 1:
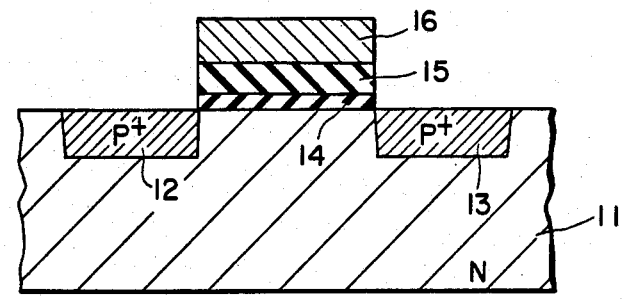
FIG. 1 is a sectional view showing a prior-art MNOS Tr.
Figure 2:
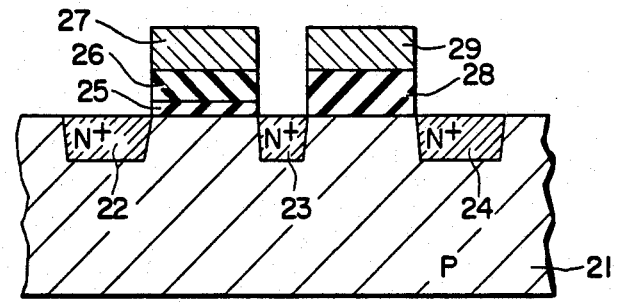
FIG. 2 is a sectional view showing a nonvolatile semiconductor memory device which is an embodiment of this invention.

FIG. 2 shows an example of the sectional structure of a nonvolatile semiconductor memory device of this invention. In the figure, an element on the left side is an MNOS Tr serving as a memory element, while an element on the right side is a conventional MIS Tr serving as a switching element. As the MIS Tr, a MOS (metal-oxide-semiconductor) type insulated-gate field effect transistor (hereinafter, abbreviated to "MOS Tr") is employed.

In the figure, numeral 21 designates an N (or P)-type Si body, numerals 22, 23 and 24 high impurity concentration regions of P (or N)-type conductivity (P+ (or N+)-type layers), numeral 25 a very thin $SiO_2$ film, numeral 26 an $Si_3N_4$ film, numeral 28 a gate insulating film, and numerals 27 and 29 gate electrodes made of polycrystalline silicon (poly-Si).

By way of example, the body 21 was made a P-type Si substrate having an impurity concentration of $3 \times 10^{15}/cm^3$ (a well diffused region of P-type conductivity or an epitaxially grown layer of P-type conductivity formed in or on an N-type Si substrate may also be employed). The regions 22, 23 and 24 were N+-type diffused layers having an impurity concentration of $2 \times 10^{20}/cm^2$ and a depth of 0.5 μm. The $SiO_2$ film 25 had a thickness of 2 nm, the $Si_3N_4$ film 26 had a thickness of 50 nm, and the $SiO_2$ film 28 had a thickness of 75 nm. The gate electrodes 27 and 29 were made of poly-Si layers having a thickness of 0.4 μm and a sheet resistance of 150 $\Omega/\square$. The MNOS Tr exhibited an initial threshold voltage of +0.2 V. However, the threshold voltage shifted to approximately +2 V by applying a writing voltage to the gate electrode (at least +20 V), and if shifted to approximately −7 V by applying an erasing voltage to the gate electrode (at least −20 V). The threshold voltage of the MOS Tr being the switching element was approximately +1 V.

There has heretofore been the opinion that the MNOS Tr employing polycrystalline silicon for the gate electrode has a poor nonvolatility. Experiments have revealed, however, that a poly-Si MNOS Tr which exhibits characteristics bearing comparison with those of an Al-gate MNOS Tr is produced by forming the N+-type diffused layers 22, 23 and 24 by the use of a method such as the ion-implantation process. Accordingly, there is no disadvantage attributed to the adoption of the poly-Si gate, and a memory cell having features to be described below can be obtained.

The first feature is that, since the gate electrode of the MNOS Tr is made of poly-Si, a word (row address line of a memory matrix becomes poly-Si, an aluminum interconnection being usable for a data line. The second feature is that, owing to the presence of the switching transistor, an offset gate structure ordinarily adopted in prior-art MNOS Tr's is unnecessary, so the conductance of the whole memory cell increases. Thirdly, a decoder for driving the memory cell may drive only the switching transistor in a reading mode, and the load capacitance as viewed from the decoder side decreases. In a writing mode, only the MNOS Tr may be decoded and the function can be separated from that of a decoder for reading, so that the decoder circuit becomes simple. Fourthly, poly-Si is better in the patterning accuracy than Al, and the diffusion layer can be formed using the poly-Si itself as a mask, so that any surplus tolerance for alignment is unnecessary and that the memory cell area becomes small.

These features, of course, reduce the occupying area of the memory matrix and shortens the signal delay time. It must not be forgotten, however, that a peripheral circuit portion simultaneously has the occupying area reduced and the operating speed rendered high by forming the whole peripheral circuit of the Si gates.

Figure 3:
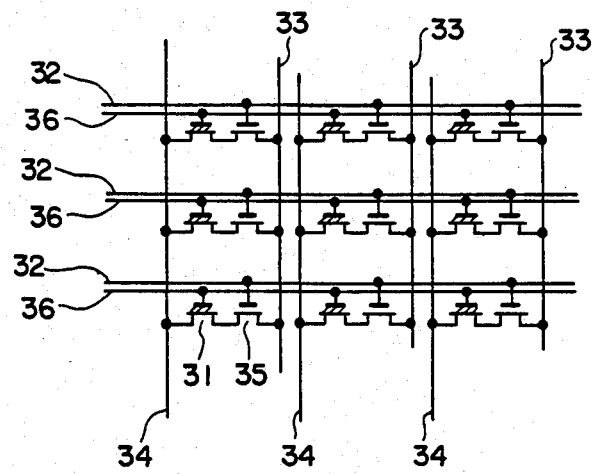
FIG. 3 is a schematic circuit diagram of a memory matrix of this invention which is constructed by the use of the memory device shown in FIG. 2.

FIGS. 3 shows an example of a memory matrix construction in which each memory cell is the memory device of this invention shown in FIG. 2. The matrix is formed in such a way that a series connection consisting of an MNOS Tr 31 and a switching transistor 35 makes up 1 bit. A word line for read (row address line in a reading mode) 32 is formed integrally with the gate electrode of the switching transistor, and is made of poly-Si. A word line for write (row address line in a writing mode) 36 is formed integrally with the gate electrode of the MNOS Tr, and is made of poly-Si. In the reading mode, the line 36 need not be decoded. All the lines may be set at a certain fixed potential (the ground potential in case of the N-channel MNOS Tr) with which whether the MNOS Tr is being written or being erased can be distinguished. On the other hand, in the writing mode, the line 36 is decoded, and a writing voltage is applied thereto. As a data line (data fetch line) 33 and a voltage supply line 34, Al interconnections can be used. The data line and the voltage supply line are respectively connected with the drain (24) and the diffused source layer (22) of the corresponding bit.

According to the construction of FIG. 3, in comparison with a case of forming a matrix by the use of Al-gate MNOS Tr's, the load capacity of the reading word line 32 can be made about ½, the load capacity of the data line 33 about ½, the resistance of the data line 33 one-hundredth, and the conductance of the memory cell about 2 times, with the result that the signal delay time in the memory matrix portion can be made about ⅛. It was actually verified experimentally that the operating speed of the whole integrated circuit including the peripheral circuit is approximately 150 nanoseconds, which speed is much higher than the operating speed, approximately 1 microsecond of a prior-art integrated circuit employing Al-gate MNOS Tr's. The memory cell area per bit could be made about 400 $\mu m^2$, which area is approximately 1/6 of about 2,500 $\mu m^2$ in a prior-art memory matrix employing the Al-gate MNOS Tr's.

Figure 4:
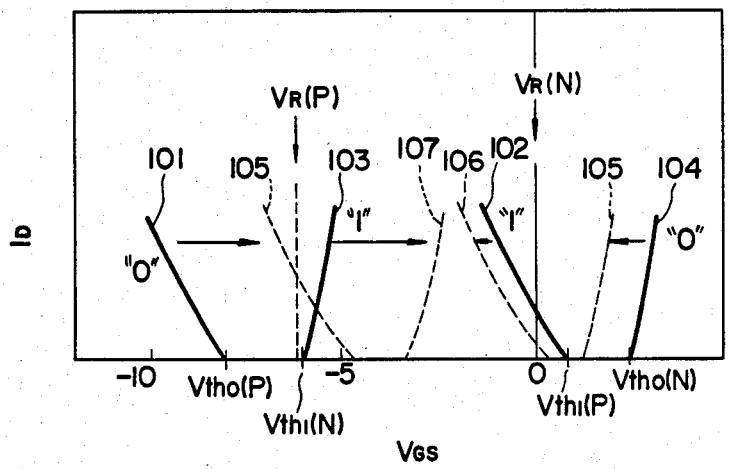
FIG. 4 is a diagram showing the characteristics of the memory device of this invention by the use of the transfer characteristics of an MNOS Tr.

Besides the above merits, especially in case of applying this invention to the N-channel MNOS Tr, there are the features that two sorts of nonvolatilities are improved and that the reliability of the device is enhanced. FIG. 4 shows transfer curves of the MNOS Tr, in which the gate-source voltage $V_{GS}$ is taken on the axis of abscissas and the drain current $I_D$ on the axis of ordinates. Description will now be made with reference to FIG. 4. In the P-channel MNOS Tr, the characteristic of a written state (nonconductive state of the MNOS Tr, hereinbelow termed "0" state) is as illustrated at 101, and the threshold voltage $V_{th0}(P)$ at that time is approximately −8 V. On the other hand, the characteristic of an erased state (conductive state of the MNOS Tr, hereinafter called "1" state) is as illustrated at 102, and the threshold voltage $V_{th1}(P)$ at that time is about +1 V. In order to detect the difference of the two states, ordinarily a voltage $V_R(P)$ of approximately −6 V is applied to the gate of the MNOS Tr so as to sense whether current flows or not. However, a feeble writing occurs on account of the gate voltage $V_R(P)$ applied at this time. Accordingly, when the reading is repeated, the threshold voltage of the "1" state approaches that of the "0" state gradually. Finally, a misreading takes place. Heretofore, the number of read accesses has thus been limited to about $10^7$–$10^{11}$. In contrast, in the case of the N-channel MNOS Tr, the characteristic of the "1" state is as illustrated at 103 and the threshold voltage $V_{th1}(N)$ is approximately −7 V, while the characteristic of the "0" state is as illustrated at 104 and the threshold voltage $V_{th0}(N)$ is approximately +2 V. Accordingly, it is unnecessary for detecting the difference of the states to apply any voltage to the gate of the MNOS Tr, and the reading can be effected with the gate grounded (reading voltage $V_R(N)=0$ V). It may be thought that, with the gates grounded, one specific bit will be unable to be addressed in the reading mode under the state under which the memory devices are arrayed into the matrix. In this invention, however, the switching transistors are disposed in series with the MNOS Tr's, and one specific bit can be addressed by selecting the corresponding switching transistor. Therefore, when the N-channel transistor is employed in the memory cell of FIG. 2, the feeble writing in the reading mode does not take place, and the limitation to the number of read accesses can be removed. This has the effect of improving the first nonvolatility.

When the N-channel element is employed in the memory cell of FIG. 2, the effect of prolonging the unpowered nonvolatile data storage time of the memory is further brought about. The threshold voltages $V_{th0}$ and $V_{th1}$ in the respective states "0" and "1" of the MNOS Tr vary slowly towards the zero voltage while the device is let stand. Herein, with the P-channel MNOS Tr, the gate voltage $V_R(P)$ of $-6$ V is applied for the detection, and hence, when the characteristic curve 101 of the "0" state moves e.g. as indicated by a curve 105, a misreading occurs. Accordingly, the unpowered nonvolatile data storage time is thus determined. A curve 106 illustrates a characteristic change of the "1" state. In contrast, in the case of the N-channel element, even if the characteristic curves 103 and 104 move towards the zero voltage and become as illustrated by curves 107 and 108 respectively with the lapse of time, the discrimination of both the states is still possible because the reading gate voltage $V_R(N)$ of the MNOS Tr is zero. Accordingly, the nonvolatile data storage time can be sharply improved. This has the effect of improving the second nonvolatility.

As described above, this invention makes the integration density high and also the operating speed high, and besides improves the nonvolatility characteristics sharply, so it can enhance reliability.

Figure 5:
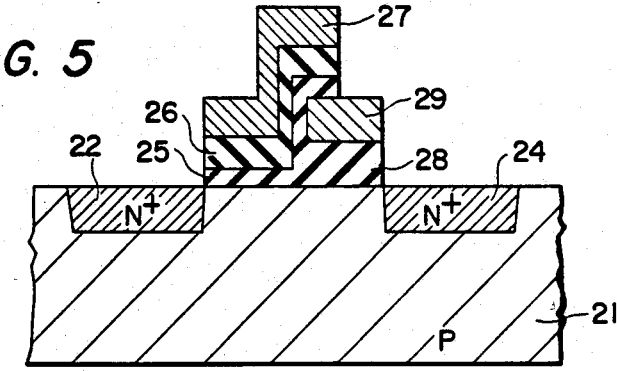
FIG. 5 is a sectional view showing a nonvolatile semiconductor memory device which is another embodiment of this invention.

A structure with the intermediate layer 23 omitted in the memory cell of FIG. 2 is shown in FIG. 5. In the example of FIG. 5, a poly-Si gate electrode 29 of the switching transistor was fabricated by a first manufacturing step, and a poly-Si gate electrode 27 of the MNOS Tr portion was fabricated by a second manufacturing step. It goes without saying that the converse is also possible. Since, however, the example of FIG. 5 can produce a better MNOS Tr of more excellent nonvolatility in accordance with experiments, it is more practical.

According to this embodiment, the area of the memory cell further decreases by the space between the two gates in FIG. 2, and it can be made about 250 $\mu m^2$ per bit. Moreover, since a process for forming the MNOS Tr is complicated, it is rather complicated to form the gate electrodes of the MNOS Tr and the switching Tr by the identical poly-Si processing step, and the characteristics of the MNOS Tr and those of the switching Tr become inferior. In contrast, when the poly-Si gates are formed by the individual steps as in the present embodiment, the steps for forming the MNOS Tr and the switching Tr can be controlled independently of each other, and elements of the most excellent characteristics can be obtained for both the transistors.

Although, in the structure of FIG. 5, gate electrodes 27 and 28 overlap, an embodiment in which they are separated and which is structurally the same as in FIG. 2 is also considered. In this case, the memory cell area per bit increases to some extent, but the signal delay time can be made shorter by the overlap capacitance between the gates of both the transistors.

Now, description will be made of the write, read and erase operations of the memory device of this invention.

Figure 6A:
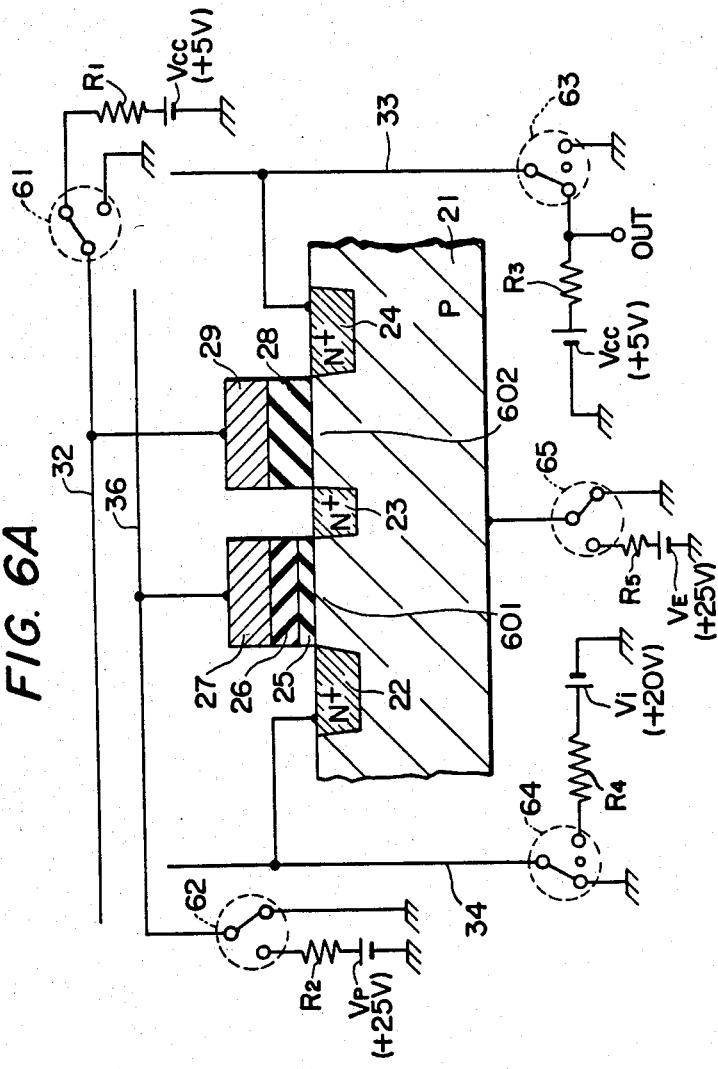
FIG. 6A is a schematic circuit diagram showing a method of applying a voltage in the reading mode of the memory device of this invention.
Figure 6C:
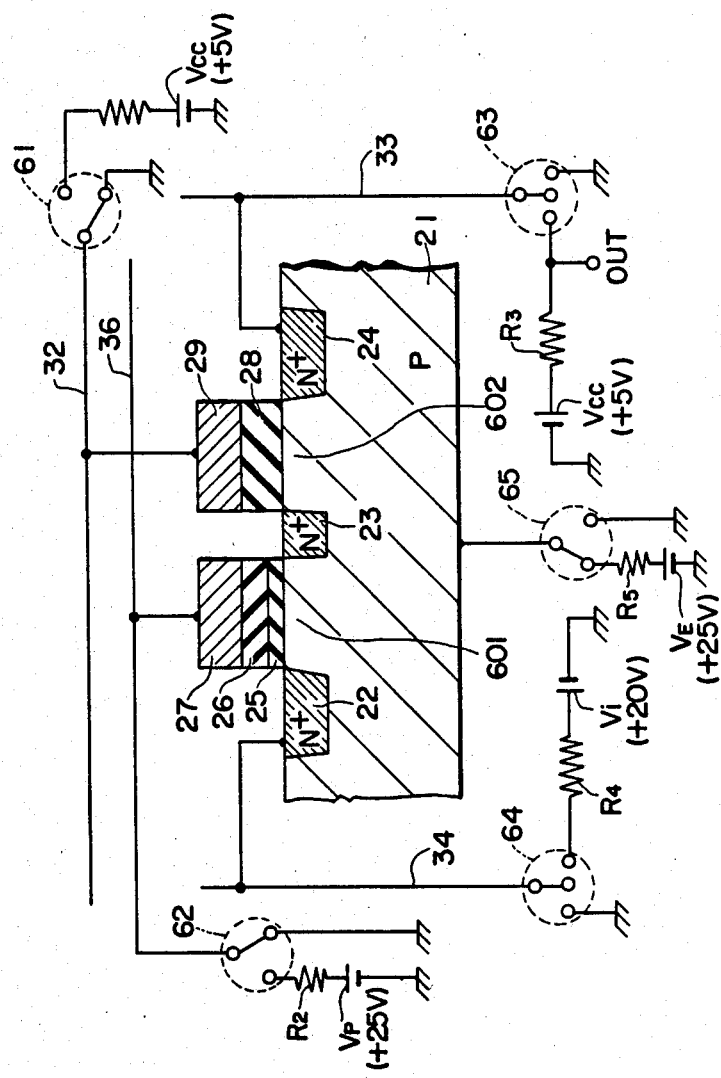
FIG. 6C is a schematic circuit diagram showing a method of applying a voltage in the erasing mode of the memory device of this invention.

FIG. 6A illustrates a method of applying a voltage in the reading mode, FIG. 6B a method of applying a voltage in the writing mode, and FIG. 6C a method of applying a voltage in the erasing mode. In each of these figures, only the memory cell of a selected bit in the memory matrix is shown. In FIGS. 6A, 6B and 6C, numerals 61, 62, 63, 64 and 65 designate switching elements (or switching circuits) constructed of e.g. MOS Tr's. The elements 61, 62 and 65 are two-way switches, and the elements 63 and 64 are three-way switches. In the figures, $V_P$ indicates a programming voltage source (writing voltage source), $V_{CC}$ a supply voltage source, $V_E$ an erasing voltage source, and $V_i$ a voltage source of a predetermined voltage. $R_1$, $R_2$, $R_3$, $R_4$ and $R_5$ indicate resistors.

As illustrated in FIG. 6A, in the reading mode of the memory, the memory cell of the selected bit has the supply voltage $V_{CC}$ (approximately $+5$ V) applied to its data line 33, has its voltage supply line 34 and writing word line grounded, and has the supply voltage $V_{CC}$ applied to its reading word line. If the MNOS Tr is in the erased state, a channel 601 is conductive because the threshold voltage $V_{th}(N)$ of the MNOS Tr is negative. A channel 602 is also conductive because the gate electrode of the switching MOS Tr is set at the supply voltage. Therefore, an output terminal OUT becomes substantially the ground potential. Conversely, if the MNOS Tr is in the written state, the threshold voltage $V_{th}(N)$ of the MNOS Tr is positive and hence the channel 601 is nonconductive, so that the output terminal OUT becomes substantially the supply voltage. In this way, the "1" state of the MNOS Tr (conductive state of the MNOS Tr) and the "0" state thereof (nonconductive state thereof) can be read out.

As illustrated in FIG. 6B, in the writing mode of the memory, the memory cell of the selected bit has its data line 33 grounded, has the gate of the switching MOS Tr fed with the supply voltage $V_{CC}$ (has the supply voltage applied to the reading word line), and has its voltage supply line 34 connected to the predetermined-voltage source so as to apply the voltage $V_i$ of approximately $+20$ V to the N$^+$ layer 22 through the resistor R$_4$. If the MNOS Tr is in the erased state, the threshold voltage $V_{th}(N)$ is negative and hence the channel 601 is conductive, and the switching MOS Tr is also conductive because the supply voltage $V_{CC}$ is applied to the gate electrode 29, so that the diffused layer 22 becomes substantially the ground potential. When, under this state, the programming voltage $V_P$ of about $+25$ V is applied to the gate electrode of the MNOS Tr (the programming voltage is applied to the writing word line), electrons within an inversion layer in the surface of the channel 601 transit to trap levels in the interface between the Si$_3$N$_4$ film 26 and the thin SiO$_2$ film 25 owing to the tunnel effect, and they are stored therein. As a result, the threshold voltage $V_{th}(N)$ shifts onto the positive side, that is, data "0" is written.

At this time, memory cells on the same row as in the selected bit have the voltages $V_{CC}$ and $V_P$ applied to the gate electrodes 29 and 27 by the reading word line 32 and the writing word line 36 respectively. By putting the data line 33 into the open state (non-selected state), however, switching MOS Tr's are cut off. Accordingly, since the voltage $V_i$ is kept applied to the voltage supply line 34, when the voltage $V_P$ is applied to the gate electrode 27 of the MNOS Tr the potential of the surface inversion layer of the channel 601 becomes the voltage $V_i$, so that a voltage acting on the gate insulating film becomes $(V_P-V_i)$. Since this voltage has a small magnitude of about 5 V, the writing proceeds only very slowly, and almost no writing occurs in a practical range of write times.

In memory cells on the same column as in the selected bit, the gate electrodes 27 and 29 are grounded (both the reading word line and the writing word line fall into the ground potential), and the writing does not take place at all.

As illustrated in FIG. 6C, in the erasing mode of the memory, the erasing voltage $V_E$ of about $+25$ V is applied to the Si substrate 21 with the gate electrode 27 of the MNOS Tr grounded (with the writing word line grounded). At this time, also the gate electrode 29 of the switching MOS Tr is grounded, both the data line 33 and the voltage supply line 34 are held in the open state, and the N+ layers 22 and 24 are held in a floating condition. When the P-type Si substrate is positively biased, holes are accumulated in the channel 601 of the MNOS Tr and tunnel-transit to the interface between the Si₃N₄ film 26 and the SiO₂ film 25. When charges are stored in the interface, the threshold voltage $V_{th}(N)$ of the MNOS Tr shifts onto the negative side, and the transistor returns to the "1" state (conductive state). In the erasing mode, PN-junctions within the P-type Si substrate are forward-biased, so that all the N+ layers need to be kept in the electrically floating condition.

Figure 7A:
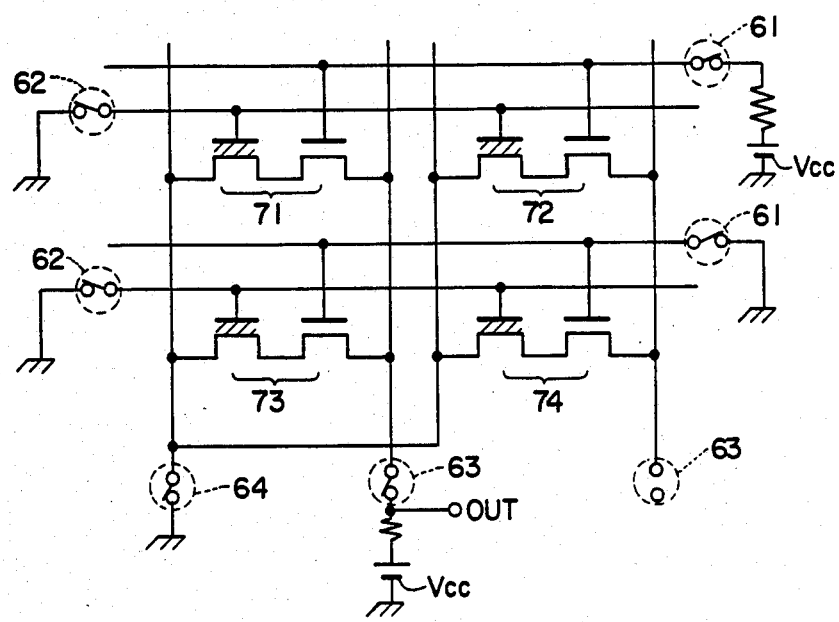
FIG. 7A is a schematic circuit diagram showing a method of applying a voltage in the reading mode of the memory matrix of this invention which is constructed of the memory device of this invention.
Figure 7B:
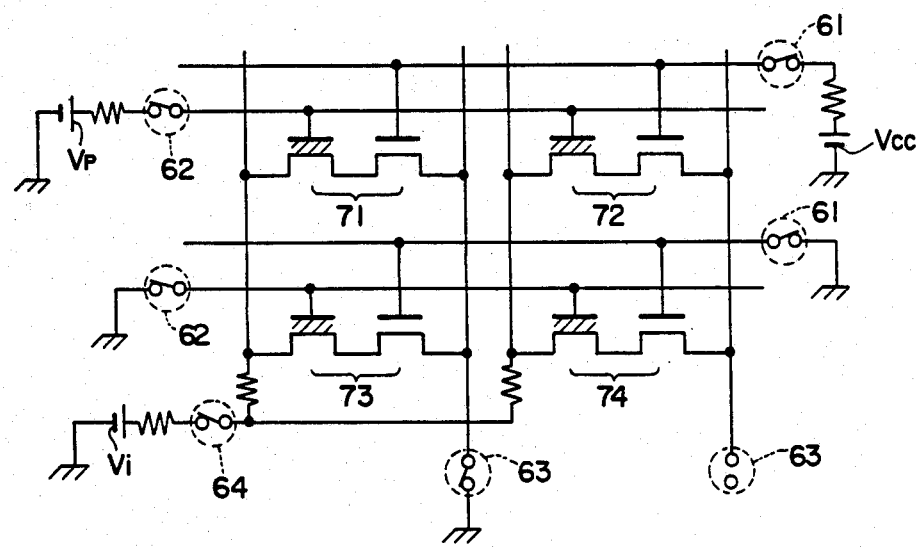
FIG. 7B is a schematic circuit diagram showing a method of applying a voltage in the writing mode of the memory matrix of this invention which is constructed of the memory device of this invention.

To sum up the above, the voltage applying method in the reading mode is illustrated in FIG. 7A, and the voltage applying method in the writing mode is illustrated in FIG. 7B. Although FIGS. 7A and 7B show a memory matrix of 4 bits for the sake of brevity, voltages may be similarly applied even in a memory matrix of a larger of number of bits. In the illustration of FIGS. 7A and 7B, a memory cell 71 is selected among four memory cells 71, 72, 73 and 74. In the erasing mode, the memory cells of all the bits are simultaneously erased.

There may be employed a memory cell construction in which, conversely to the memory cell described above, the data line is connected on the MNOS Tr side, that is, the data line is connected to the N+-type diffused layer 22 and with which all the switching MOS Tr's are cut off in the writing mode. In this case, a ground line can be connected to the N+-type diffused layers 24 and be made common to all the bits.

An example of a method of manufacturing the memory device of this invention will now be described with reference to FIGS. 8A, 8B, 8C, 8D, 8E, 8F, 8G and 8H.

Figure 8A:
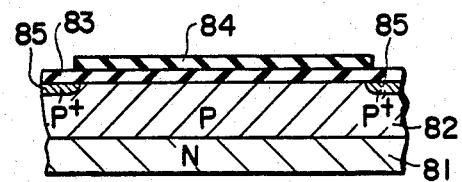
FIGS. 8A, 8B, 8C, 8D, 8E, 8F, 8G and 8H are device sections showing an example of a manufacturing process of the memory device of this invention in the order of steps.

A: Using an N-type silicon substrate 81, a memory well and a peripheral circuit well are formed by the well diffusion process with a P-type impurity. The reason why a memory and a peripheral circuit are isolated by the wells is that an erasing voltage is sometimes applied to the memory well in the erasing mode. In FIG. 8A, only the portion of the memory well 82 is depicted.

Subsequently, the surface of the substrate is thermally oxidized to form an SiO₂ film 83 being 80 nm thick. Further, silicon nitride (Si₃N₄) film 84 being 140 nm is deposited. The Si₃N₄ film 84 is removed by the photoetching process so as to leave areas in which a MNOS Tr and a MOS Tr are to be formed. Further, the ion implantation of B+ (boron ions) is carried out to form P+-type layers 85 in regions between the devices. (FIG. 8A)

Figure 8E:
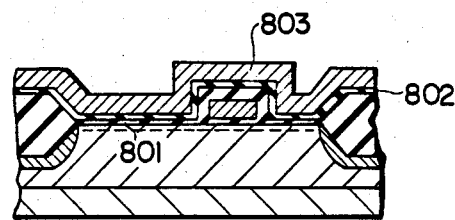
Figure 8B:
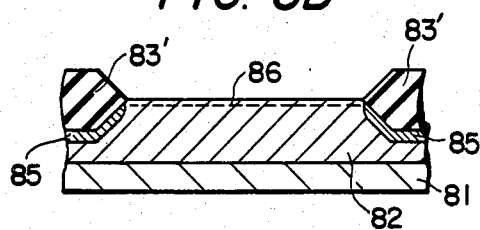

B: The thermal oxidation is executed in the state in which the Si₃N₄ film 84 remains, to form inter-device isolation oxide films 83' being about 1 μm thick. Thereafter, the Si₃N₄ film 84 and the underlying oxide film 83 are removed, and the entire surface area of the substrate is subjected to the ion implantation of boron ions in order to adjust the threshold voltage of the MOS Tr (ion-implanted layer: 86). (FIG. 8B)

Figure 8F:
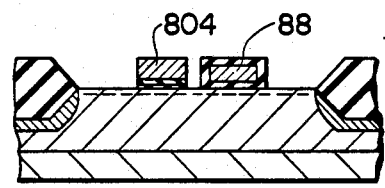
Figure 8C:
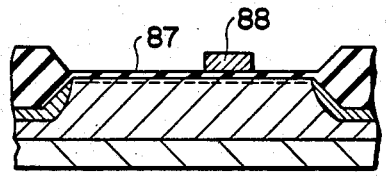

C: The substrate surface is thermally oxidized, to form a gate insulating film 87 which is made of an SiO₂ film about 75 nm thick. Further, polycrystalline silicon (poly-Si) about 400 nm thick is deposited. After diffusing phosphorus, the poly-Si layer is etched into a gate electrode 88 by the photoetching process. (FIG. 8C)

Figure 8G:
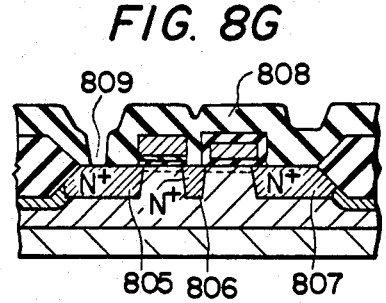
Figure 8D:
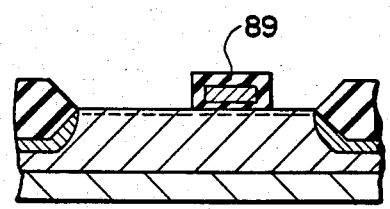

D: After removing an unnecessary part of the gate insulating film 87, the poly-Si gate is covered with a passivation (insulating) film 89. This step is conducted because, if in case of depositing an Si₃N₄ film later it is deposited directly on the poly-Si, the processing becomes difficult. As a method for covering only the poly-Si portion, the low-temperature wet oxidation is employed in which the oxidation rate greatly varies depending on the concentration of phosphorus. (FIG. 8D)

E: A very thin oxide film 801 being about 2 nm thick, the Si₃N₄ film 802 being about 50 nm thick, and a poly-Si film 803 being about 400 nm thick are successively formed. (FIG. 8E)

F: By the photoetching process, the poly-Si 802 is etched into a gate electrode 804 of the MNOS Tr. Subsequently, unnecessary parts of the Si₃N₄ film 802 and the SiO₂ film 801 are removed. (FIG. 8F)

G: Using the respective gate electrodes 88 and 804 of the MOS Tr and the MNOS Tr as a mask, N+-type layers 805, 806 and 807 are formed by diffusion or ion implantation. Subsequently, an inter-layer insulating film 808 for Al interconnections is deposited, and a contact hole 809 is provided. (FIG. 8G)

Figure 8H:
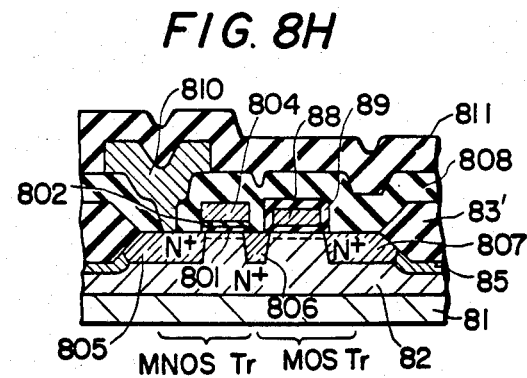

H: Aluminum is evaporated to a thickness of about 1 μm, and it is patterned into an interconnection 810 by photoetching. At last a protective film (0.6 μm thick) 811 is deposited, to finish the memory device. (FIG. 8H)

In the memory cell thus produced, the impurity concentration of the N-type Si substrate 81 was $5 \times 10^{14}$ cm$^{-3}$, the depth of the P-type well 82 was 6 μm, the impurity concentration of the P-type well was $3 \times 10^{15}$ cm$^{-3}$, the depth of the N+-type layers 805, 806 and 807 was 0.5 μm, and the impurity concentration of these layers was $2 \times 10^{20}$ cm$^{-3}$. The P+-type layer formed in the inter-device isolation region had a depth of about 1 μm and an impurity concentration of $1 \times 10^{16}$ cm$^{-3}$.

An example of an EAROM of this invention constructed in the memory device of this invention will now be explained.

Figure 9:
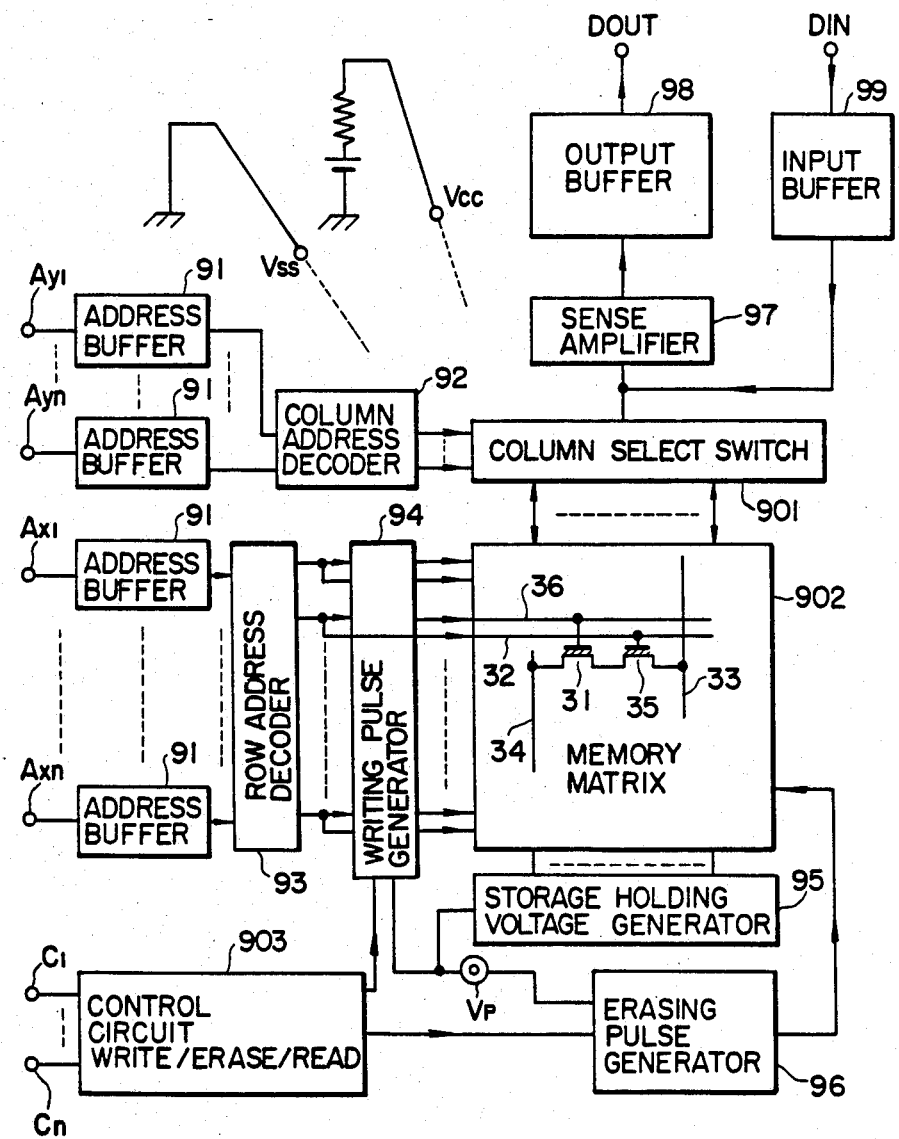
FIG. 9 is a block diagram of an EAROM of this invention as incorporated in the memory device of this invention.

FIG. 9 shows a circuit arrangement diagram thereof. There are five sorts of pins listed below.

(1) Power supply input pins (three)

$V_{SS}$: Ground input terminal, $V_{CC}$: Power supply input terminal for feeding all the circuits with a supply voltage (e.g., +5 V), and $V_P$: Programming voltage (e.g., +25 V) supply input terminal.

In some circuit systems, a single power supply operation in which all the circuits are operated by the programming voltage source is possible.

(2) Address input pins $A_{x1}$-$A_{xn}$, $A_{y1}$-$A_{yn}$: Input terminals which receive addressing signals for assigning addresses of the memory matrix. The number of these pins depends upon the size of the matrix.

(3) Data output pin DOUT: Terminal which delivers data in the reading mode.

(4) Data input pin DIN: Terminal which receives data in the writing mode.

The functions of both the pins (3) and (4) may be effected by an identical pin, and such a measure is taken in many cases.

(5) Mode control input pins $C_1$-$C_n$: Terminals which receive mode control signals for controlling the chip into any of the three modes of read, write and erase. If any other control function such as chip select is necessary, it may be added. The number of the pins depends upon the number of control functions.

First, the reading operation will be set forth. In the reading mode, one switching transistor 35 is selected by an address buffer 91 and decoders 92 and 93. At this time, none of a writing pulse generator 94, a storage holding voltage generator 95 and an erasing pulse generator 96 is operated, so that outputs of the respective generators 94, 95 and 96 are grounded. Under this state, whether or not current flows through the selected memory cell is detected by a sense amplifier 97, and data is delivered.

In the writing mode, the address buffer 91 and the decoders 92 and 93 are actuated in the same manner as in the reading mode. The writing pulse generator 94 receives a signal from the row address decoder 93, and generates a write pulse of high voltage $V_P$ (e.g., a writing voltage of $+25$ V and a pulse width of 100 μs) on one selected gate line 36 of the MNOS Tr's. The storage holding voltage generator 95 supplies a storage holding voltage $V_i$ (e.g., $+20$ V) somewhat lower than the programming voltage $V_P$ to the N+-type layers on the MNOS Tr sides of all the memory cells. In case where the execution of write has been assigned by a data input signal (for example, when the input signal is "0"), the data line of the selected memory cell has its current pulled out by the input buffer and therefore becomes the ground potential. Accordingly, the write operation of the selected memory cell is performed. In the case where the data input is "1", the input buffer does not pull out the current, so that the storage holding voltage is also applied to the selected memory cell and that the write is not performed.

In the erasing mode, none of the decoders 92 and 93, the writing pulse generator 94 and the storage holding voltage generator 95 is actuated. The erasing pulse generator 96 produces an erasing pulse of the voltage $V_E$ (e.g., an erasing voltage of $+25$ V and a pulse width of 10 msec), and applies it to the memory well or the semiconductor substrate. Thus, all the bits are erased at the same time.

If the erasing functions for the individual word lines are necessary, the decoder 93 and the writing pulse generator 94 may be operated conversely to the operation in the writing mode. That is, only the selected memory gate line 36 is grounded, and the same voltage $V_E$ as that of the well is applied to all the other memory gate lines.

What is claimed is:

1. A nonvolatile semiconductor memory circuit comprising:

a memory matrix having a plurality of memory cells formed in a surface region of a semiconductor body of a first conductivity type, each of which memory cells is comprised of a metal-nitride-oxide-semiconductor device having a first channel provided in said surface region of said body and a first region of second conductivity type opposite to said first conductivity type and a metal-insulator-semiconductor device having a second channel provided in the surface region of said semiconductor body and having a second region of second conductivity type opposite to said first conductivity type, wherein said first and second channels are connected in series with one another, wherein the metal-nitride-oxide-semiconductor device has a first insulated gate electrode which is coupled to a writing word line driven by first means for selectively driving said writing word line in a writing mode, and the metal-insulator-semiconductor device has a second insulated gate electrode which is coupled to a reading word line which is separate from said writing word line and which is driven by second means for selectively driving said reading word line in a reading mode and in said writing mode;

means for addressing one specific memory cell of said plurality of memory cells by selecting a metal-insulator-semiconductor device of said specific memory cell; and means for applying in an erasing mode an erasing voltage to a substrate of said metal-nitride-oxide-semiconductor device and metal-insulator-semiconductor device while grounding said first and second insulated-gates of the memory cell and for holding said first region of said metal-nitride-oxide-semiconductor device of said memory cell in a floating condition.

2. A nonvolatile semiconductor memory according to claim 1, further comprising means for setting in the reading mode the first insulated gate electrode of the memory cell at a certain fixed potential between a threshold voltage of said metal-nitride-oxide-semiconductor device at a written state and a threshold voltage at an erased state.

3. A nonvolatile semiconductor memory according to claim 2, wherein the first insulated-gate electrode of the memory cell is set substantially at a ground potential in the reading mode.

4. A nonvolatile semiconductor memory according to claim 1, further comprising means for applying in the writing mode a writing voltage Vp to one selected writing word line, and means for setting up in a writing mode a potential Vc of a channel under a first insulated-gate electrode of one specific memory cell so as to produce a different voltage (Vp-Vc) larger than a voltage necessary for writing on said metal-nitride-oxide-semiconductor device to occur in a predetermined write time.

5. A nonvolatile semiconductor memory according to claim 1, wherein a said first region of said metal-insulator-semiconductor device is connected to a data line, and the data line is made of aluminum.

6. A nonvolatile semiconductor memory according to claim 5, wherein said first and second insulated-gate electrodes are made of polycrystalline silicon.

7. A nonvolatile semiconductor memory according to claim 6, wherein said first and second insulated-gate electrodes are respectively provided integrally with said writing word line and said reading word line each of which is made of polycrystalline silicon.

8. A nonvolatile semiconductor memory according to claim 1, wherein said metal-insulator-semiconductor transistor is a metal-oxide-semiconductor transistor.

* * * * *